United States Patent
Long et al.

(10) Patent No.: US 10,437,296 B1
(45) Date of Patent: Oct. 8, 2019

(54) DISK TRAY FOR NON-VOLATILE MEMORY EXPRESS OVER FABRIC SOLID STATE DRIVE

(71) Applicant: Aupera Technologies, Inc., Vancouver (CA)

(72) Inventors: Chun Long, Shenzhen (CN); Yonghui Zhu, Shenzhen (CN); Yu Feng Liao, Surrey (CA)

(73) Assignee: Aupera Technologies, Inc. (CA)

( * ) Notice: Subject to any disclaimer, the term of this patent is extended or adjusted under 35 U.S.C. 154(b) by 0 days.

(21) Appl. No.: 16/241,136

(22) Filed: Jan. 7, 2019

(51) Int. Cl.
  *G06F 1/18* (2006.01)
  *H05K 7/20* (2006.01)
  *G06F 1/20* (2006.01)
  *H05K 7/14* (2006.01)

(52) U.S. Cl.
  CPC .............. *G06F 1/187* (2013.01); *G06F 1/20* (2013.01); *H05K 7/1489* (2013.01); *H05K 7/20736* (2013.01)

(58) Field of Classification Search
  CPC ......... G06F 1/187; G06F 1/20; H05K 7/1489; G11B 33/124
  USPC ........... 361/679.32, 679.33, 679.34, 679.37, 361/679.39
  See application file for complete search history.

(56) References Cited

U.S. PATENT DOCUMENTS

| | | | | |
|---|---|---|---|---|
| 7,944,687 B2 * | 5/2011 | Walker | .................... | G06F 1/187 235/490 |
| 8,799,935 B2 * | 8/2014 | Jung | .................. | G11B 33/1426 361/679.33 |
| 9,801,299 B1 * | 10/2017 | Chen | .................... | G11B 33/124 |

* cited by examiner

*Primary Examiner* — Mukundbhai G Patel
(74) *Attorney, Agent, or Firm* — Timothy T. Wang; Ni, Wang & Massand, PLLC

(57) ABSTRACT

A non-volatile memory express over fabric solid state drive mounting device detachably connected to an outer support frame, having a thermally conductive tray, a left support wall demountably connected to the tray, the left support wall having a left guide groove, a right support wall demountably connected to the tray, the right support wall having a right guide groove, a disk slidably engaged within the left support wall left guide groove and the right support wall right guide groove, a circuit board having at least one component, the circuit board demountably connected to the tray and detachably engaged to the disk drive and a flexible heat dissipation pad contacting the at least one component and detachably contacting the tray.

18 Claims, 3 Drawing Sheets

DISK TRAY FOR NON-VOLATILE MEMORY EXPRESS OVER FABRIC SOLID STATE DRIVE

BACKGROUND

Technical Field

The instant disclosure is related to a disk tray and more especially to a Non-Volatile Memory Express over fabric solid state drive disk tray with a thermal dissipation device.

BACKGROUND

With the advent of cloud computing, big data, mobile Internet and smart cities, Internet data traffic has been exploding, and providers urgently need to convert their existing data centers to cloud data centers to provide more flexible business and application support.

Currently, data centers are predominantly based on 10G Ethernet architectures having PCIE interface disk drives. To be able to adequately service the ever-expanding data load, these data centers need to be upgraded for enhanced bandwidth capabilities in parallel with the existing infrastructures.

One method to meet this need is to convert current PCIE interface disk drives to Ethernet interface disk drives, so that the transmission rate of the disk drive module is upgraded to 25 Gbit/s. Converting the system to increase the throughput incurs a thermal load cost due to the increased load on the conversion processor.

Currently, in cloud computing, there are an increased number of storage devices used by data centers, requiring reliability, high density and stability. In many systems, a toothed heat sink is fastened onto the PCB board by a clip or a screw, and thermal energy directed to a heat sink for convection to ensure the processor operates at an appropriate temperature.

The direction and position of the heat sink and the design of the air duct are restricted by the limited space available. For 24 storage solid storage devices (SSDs) built into a 2U space, the size cannot exceed 17.6 mm. Therefore, the design of the thermal dissipation device coupled to the processor on a circuit board is an important consideration.

SUMMARY

In one embodiment, a non-volatile memory express over fabric solid state drive mounting device detachably connected to an outer support frame, having a thermally conductive tray with a heat dissipation extension, a left support wall demountably connected to the tray, the left support wall having a left guide groove, a right support wall demountably connected to the tray, the right support wall having a right guide groove, a disk drive slidably engaged within the left support wall left guide groove and the right support wall right guide groove, a circuit board having at least one component, the circuit board demountably connected to the tray and detachably engaged to the disk drive and a flexible heat dissipation pad contacting the at least one component and detachably contacting the tray.

In another embodiment, a non-volatile memory express over fabric solid state drive mounting device detachably connected to an outer support frame, having a thermally conductive tray having a left support wall and a right support wall, a disk drive slidably engaged within the left support wall and the right support wall, a circuit board having at least one component, the circuit board demountably connected to the tray and detachably engaged to the disk and a flexible heat dissipation pad contacting the at least one component and detachably contacting the tray.

DETAILED DESCRIPTION OF THE INVENTION

Figure 1:
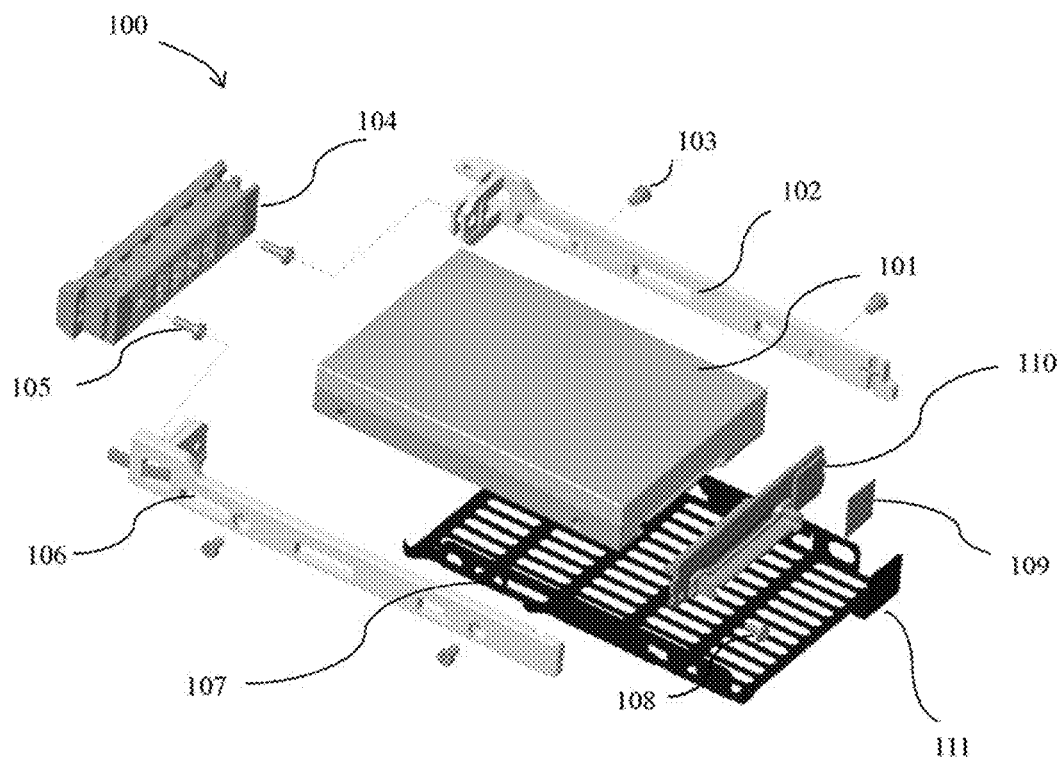
FIG. 1 is a first example of a non-volatile memory express over fabric hard drive mounting device in accordance with one embodiment of the disclosure.

The embodiments listed below are written only to illustrate the applications of this apparatus and method, not to limit the scope. The equivalent form of modifications towards this apparatus and method shall be categorized as within the scope the claims.

Certain terms are used throughout the following description and claims and refer to particular system components. As one skilled in the art will appreciate, different companies may refer to a component and/or method by different names. This document does not intend to distinguish between components and/or methods that differ in name but not in function.

In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device that connection may be through a direct connection or through an indirect connection via other devices and connections.

The disclosure provides a type of disk tray device, which performs the function of allowing upgrade of the system to SSDs by providing both disk fastening and processor on board thermal energy dissipation concurrently.

This disk tray device has been designed to be easy to assemble and disassemble, and can effectively dissipate the large amount of thermal energy generated by the processor on a circuit board.

As a large amount of thermal energy is generated during operation, one aspect of the device effectively dissipates thermal energy generated by the processor to the tray and external superstructure. This integrated thermal management of the processor to the structure effectively, decreases the thermal impact on the stability and quality of signal transmission of the processor.

In one example, a disk tray device has of a pair of support side walls respectively on the left and the right. There are fixed grooves and screw holes on the side walls for fastening the disk, tray, circuit board and disk drive panel. The device is also comprised of a thermally conductive metal tray, which is for retaining and fastening the computer disk drive and fastening the conversion module board. The tray also allows for enhanced thermal energy dissipation for the processor mounted on the circuit board. The device has a flexible heat dissipation pad, which is utilized to transfer thermal energy generated by the generator to the heat sink.

The thermal conduction pad flexibility buffers vibrational forces between the processor and metal components.

One method to assemble the device is to assemble the left and right support side walls to the panel, and insert the tray into the left and right side walls by elastic hooks situated on the left and right. The flexible heat dissipation pad is fastened at a fixed position of the tray next to the heat dissipation extension. The circuit board is installed in the middle of the edge guide at the edge guide grooves on the left and right side walls. The processor on the circuit board is aligned with the flexible heat dissipation pad, so that the processor mates to the thermal dissipation pad. The disk drive is then installed on the tray, and locked with retention screws on both sides.

Similarly, to disassemble the device the retention screws on both sides of the disk drive are removed and the disk drive is retracted to separate the male connector of the disk drive from the female connector of the conversion board. Then retention screws on the circuit board are removed and the circuit board may be removed from and the tray.

FIG. 1 depicts an example layout in which disk drive 101 provides data storage, left support sidewall 102 fastens the tray and machine screw 103 locks the disk drive. Panel 104 supports the support frame, disk drive and allows insertion and removal of the disk drive, machine screw 105 fastens the support side walls and the panel and right support side wall 106 fastens the base board. Tray 107 fastens the support sidewalls, circuit board and disk drive and machine screw 108 fastens the circuit board to the tray. Flexible heat dissipation pad 109 and heat dissipation extension 111 conducts thermal energy toward the outer support frame and circuit board 110 allows upload and download to the disk drive. The heat dissipation extension 11 is an integrated part of the tray 107 and extends outward.

In FIG. 1 tray 107 is fastened to the left support sidewall 102 and right support sidewall 106 by bending buckles on both sides and then locked into panel 104 by machine screw 105. Disk drive 101 is inserted into the guide grooves on the sides of left support sidewall 102 and right support sidewall 106. Circuit board 110 is locked into tray 107 by machine screw 108. Then disk drive 101 is pushed in the direction of circuit board 110 to overlap the circuit board, and disk drive 101 is locked to the overall support frame by four machine screws 103.

Figure 2:
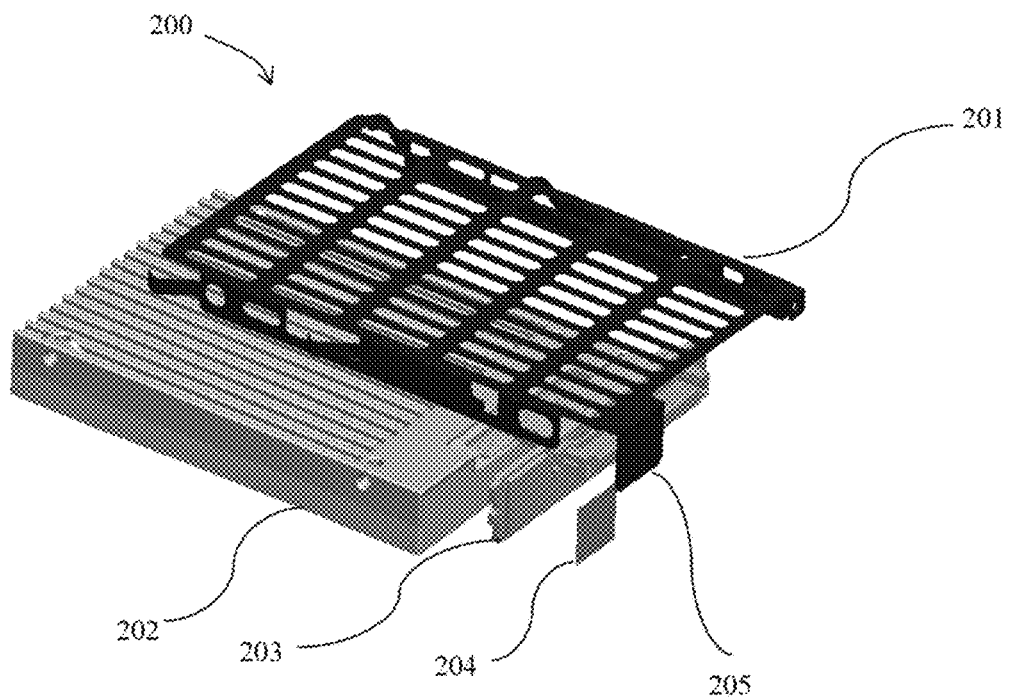
FIG. 2 is a second example of a non-volatile memory express over fabric hard drive mounting device in accordance with one embodiment of the disclosure.

FIG. 2 depicts an example layout in which tray 201 fastens the support side walls, the conversion board and the disk drive, disk drive 202 provides data storage and is connected to the circuit board 203, flexible heat dissipation pad 204, and heat dissipation extension 205 to provides thermal conduction and vibration reduction. The heat dissipation extension 205 is an integrated part of the tray 201 and extends outward.

In FIG. 2 the disk drive 202 and circuit board 203 conduct thermal energy from the processor mounted on circuit board 203 into the tray 201 through heat dissipation extension 205. A large metal sheet with a U-shaped hole in the middle is used to enhance the heat dissipation function of tray 201.

Figure 3:
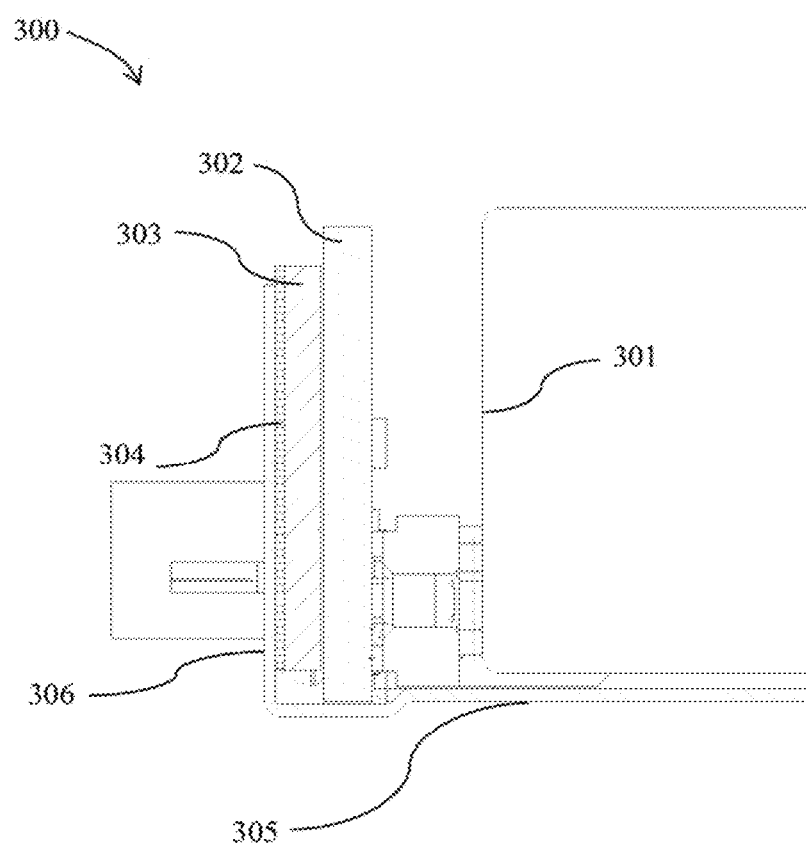
FIG. 3 is a third example of a non-volatile memory express over fabric hard drive mounting device in accordance with one embodiment of the disclosure.

FIG. 3 depicts an example layout in which disk drive 301 provides data storage and is connected to circuit board 302, processor 303 is locked to the disk drive, flexible heat dissipation pad 304 provides thermal conduction and vibration reduction and tray 305 fastens the support side walls, the circuit board and the disk drive.

FIG. 3 depicts an example cross-section drawing of the heat dissipation function of the tray. The large amount of thermal energy generated by processor 303 on circuit board 302 due to data processing is conducted into tray 305 through flexible heat dissipation pad 304 and heat dissipation extension 306. The heat dissipation extension 306 is an integrated part of the tray 305 and extends outward. Additionally, thermal energy on disk drive 301 is radiated into tray 305 for thermal energy dissipation.

The structure may fasten both the disk drive and the circuit board to the tray while providing heat dissipation for the processor on the circuit board.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that the specific order or hierarchy of steps in the processes disclosed is an illustration of example approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention. The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

References to "one embodiment," "an embodiment," "some embodiments," "various embodiments", or the like indicate that a particular element or characteristic is included in at least one embodiment of the invention. Although the phrases may appear in various places, the phrases do not necessarily refer to the same embodiment. In conjunction with the present disclosure, those skilled in the art will be able to design and incorporate any one of the variety of mechanisms suitable for accomplishing the above described functionalities.

It is to be understood that the disclosure teaches just one example of the illustrative embodiment and that many variations of the invention can easily be devised by those skilled in the art after reading this disclosure and that the scope of then present invention is to be determined by the following claims.

What is claimed is:

1. A non-volatile memory express over fabric solid state drive mounting device detachably connected to an outer support frame, comprising:
   a thermally conductive tray;
   a left support wall demountably connected to the tray, the left support wall having a left guide groove;
   a right support wall demountably connected to the tray, the right support wall having a right guide groove;
   a disk drive slidably engaged within the left support wall left guide groove and the right support wall right guide groove;
   a circuit board having at least one component, the circuit board demountably connected to the tray and detachably engaged to the disk drive;
   a flexible heat dissipation pad contacting the at least one component and detachably contacting the tray;
   a thermal dissipation extension which is an integrated part of the thermally conductive tray;
   wherein said flexible heat dissipation pad is fastened at a fixed position of the tray next to said thermal dissipation extension:
   wherein said circuit board is installed in said guide grooves on the left and right support walls, and a processor on the circuit board is aligned with the flexible heat dissipation pad, so that the processor mates to the flexible heat dissipation pad; and
   wherein said disk drive is installed on the tray and locked with a plurality of retention screws on both sides.

2. The non-volatile memory express over fabric solid state drive mounting device of claim 1 wherein the flexible heat dissipation pad provides vibration reduction to the circuit board.

3. The non-volatile memory over fabric solid state drive mounting device of claim 1 wherein mounting device conducts thermal energy from the tray to the outer support frame upon insertion of the mounting device to the outer support frame.

4. The non-volatile memory over fabric solid state drive mounting device of claim 1 further comprising spring tabs connected to the tray.

5. The non-volatile memory over fabric solid state drive mounting device of claim 1 wherein the tray having air convection slots.

6. The non-volatile memory express over fabric solid state drive mounting device of claim 1 wherein the at least one component comprises a processor electrically connected to the circuit board.

7. The non-volatile memory over fabric solid state drive mounting device of claim 1 wherein the tray is an aluminum alloy.

8. The non-volatile memory over fabric solid state drive mounting device of claim 1 wherein the mounting device is sized to fit a 2RU (rack unit) space.

9. The non-volatile memory over fabric solid state drive mounting device of claim 1 further comprising an Ethernet interface connected to the circuit board.

10. A non-volatile memory over fabric solid state drive mounting device detachably connected to an outer support frame, comprising:
    a thermally conductive tray having a left support wall and a right support wall;
    a disk drive slidably engaged within the left support wall and the right support wall;
    a circuit board having at least one component, the circuit board demountably connected to the tray and detachably engaged to the disk drive;
    a flexible heat dissipation pad contacting the at least one component and detachably contacting the tray;
    a thermal dissipation extension which is an integrated part of the thermally conductive tray; and
    wherein said flexible heat dissipation pad is fastened at a fixed position of the tray next to said thermal dissipation extension; and
    wherein said circuit board is installed in a guide groove on the left and right support walls, and a processor on the circuit board is aligned with the flexible heat dissipation pad, so that the processor mates to the flexible heat dissipation pad.

11. The non-volatile memory over fabric solid state mounting device of claim 10 further comprising spring tabs connected to the tray.

12. The non-volatile memory over fabric solid state mounting device of claim 10 wherein the tray having air convection slots.

13. The non-volatile memory over fabric solid state mounting device of claim 10 wherein the at least one component comprises a processor electrically connected to the circuit board.

14. The non-volatile memory over fabric solid state mounting device of claim 10 wherein the at least one component comprises an Ethernet switch electrically connected to the circuit board.

15. The non-volatile memory over fabric solid state mounting device of claim 10 wherein the tray is an aluminum alloy.

16. The non-volatile memory over fabric solid state mounting device of claim 10 wherein the mounting device is sized to fit a 2U space.

17. The non-volatile memory over fabric solid state mounting device of claim 10 wherein the mounting device is less than 17.6 mm in height.

18. The non-volatile memory over fabric solid state mounting device of claim 10 further comprising an Ethernet interface connected to the circuit board.

* * * * *